(12) United States Patent
Bisschops

(10) Patent No.: US 6,545,377 B2
(45) Date of Patent: Apr. 8, 2003

(54) COIL WITH COOLING MEANS

(75) Inventor: Theodorus Hubertus Josephus Bisschops, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/056,370

(22) Filed: Jan. 17, 2002

(65) Prior Publication Data

US 2002/0096946 A1 Jul. 25, 2002

(30) Foreign Application Priority Data

Jan. 25, 2001 (EP) .............................................. 01200299

(51) Int. Cl.[7] .............................. H01F 7/06; H02K 55/04
(52) U.S. Cl. ............................ 310/52; 310/52; 310/12; 310/208; 310/206
(58) Field of Search .............................. 310/12, 52–60, 310/208, 206, 203, 202, 179; 335/300

(56) References Cited

U.S. PATENT DOCUMENTS

| 5,164,626 A | 11/1992 | Oigawa | 310/208 |
| 5,896,076 A | * 4/1999 | Van Namen | 335/229 |
| 6,084,319 A | 7/2000 | Kamata et al. | 310/12 |

FOREIGN PATENT DOCUMENTS

| DE | 331707 | 1/1921 | |
| EP | 0414927 | 3/1991 | H02K/3/24 |
| JP | 55-037834 | * 3/1980 | H02K/55/04 |
| WO | WO9628276 | 9/1996 | B23Q/1/62 |
| WO | WO0001053 | 1/2000 | H02K/1/20 |

* cited by examiner

*Primary Examiner*—Thomas M. Dougherty
*Assistant Examiner*—Iraj A Mohandesi
(74) *Attorney, Agent, or Firm*—Aaron Waxler

(57) ABSTRACT

The invention relates to a coil comprising current-conducting turns (2) and cooling means (3) for cooling the coil. To improve the cooling efficiency, the coil comprises a plurality of heat conducting foil turns (4). These foil turns can be thermally connected to a cooling channel with a cooling fluid. In a preferred embodiment, the heat-conducting foil turns (4) are also the current-conducting turns (2).

20 Claims, 3 Drawing Sheets

COIL WITH COOLING MEANS

Figure 1:
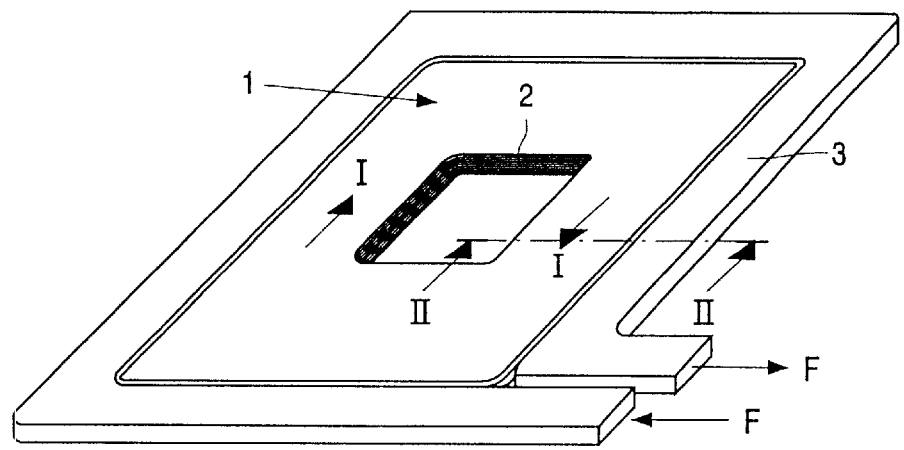

The invention relates to a coil provided with current-conducting turns and with cooling means. The invention also relates to an actuator in which such a coil is used.

Such cooled coils are generally known. The heat removal from the turns may take place, for example, by means of a cooling channel through which a cooling liquid is pumped, see e.g. EP 0414927 and DE 331707, or by means of radiation plates as known from U.S. Pat. No. 5,164,262. The cooling effect of these coils, however, is limited and certainly not ideal. The problem of the cooling is even greater if coils are used in high-power equipment. The removal of heat then becomes highly essential.

It is an object of the invention to provide a coil with a very efficient cooling.

The coil according to the invention is for this purpose characterized in that the coil is provided with a number of heat-conducting foil turns whose edge portions are cooled by the cooling means. Providing the coil with heat-conducting foil turns and cooling the edge portions thereof leads to a good heat transport to the cooled edge portions.

The edge portions could be cooled, for example, by means of an air flow. It is more efficient, however, to connect the edge portions thermally to the cooling means, i.e. to provide a physical connection through which a sufficient heat flow can be conducted. The cooling means used may be a cooling channel through which a cooling liquid is pumped. The edge portions of the foil turns must make good contact with a wall of the cooling channel.

In a coil which is to be used by preference, the heat-conducting foil turns are at the same time the current-conducting turns. The advantage of foil coils over wire coils is the greater filling factor of the current conductors, usually of copper, whereby a much higher efficiency is achieved. Many foil turns are present in each foil coil, all contributing to a very good heat dissipation. It is nevertheless also possible to construct the current-conducting turns as electrically insulated wire turns, between which the heat-conducting turns extend. Depending on the application or the available control, the I-V characteristic can be better optimized with a wire-wound coil than with a foil-wound coil. In addition, the risk of eddy currents arising is smaller in wire-wound coils than in foil-wound coils. The air gaps and the insulation provide a considerable heat barrier in normal wire-wound coils. The provision of heat-conducting turns between the coil wires and cooling of the edge portions of said turns strongly improves the removal of heat. In this latter embodiment, it is useful and sometimes imperative that the heat-conducting turns should not form a closed circuit. This is to prevent the generation of undesirable eddy currents. This objective may be achieved in that the heat-conducting foil turns are interrupted.

Preferably, the cooled coils in accordance with the invention described above may be used in an actuator which is characterized by two systems of permanent N- and Z-magnets situated one above the other, between which the coil according to the invention is accommodated, the direction of a magnetic field generated by the magnets being perpendicular to the plane in which the foil turns are oriented, while the coil is movable with respect to the magnet systems in a direction parallel to the plane in which the foil turns are oriented. High powers can be used in such an actuator, also denoted X-Y actuator. The coil may be very flat, and the air gaps between the coil and the magnets can be small, so that a highly homogeneous magnetic field can be used.

In an alternative embodiment, the coils according to the invention may be used in an actuator which is characterized by one system of alternate permanent N- and Z-magnets above which a coil according to the invention is present, the direction of a magnetic field generated by the magnets being parallel to the plane in which the foil turns are oriented, while the coil is movable with respect to the system of magnets in a direction perpendicular to the plane in which the foil turns are oriented.

The actuators mentioned above may be used as a displacement device in a component placement machine for placing components on a printed circuit board, or in a lithographic device (wafer stepper) for manufacturing integrated circuits on a semiconductor substrate.

Figure 2:
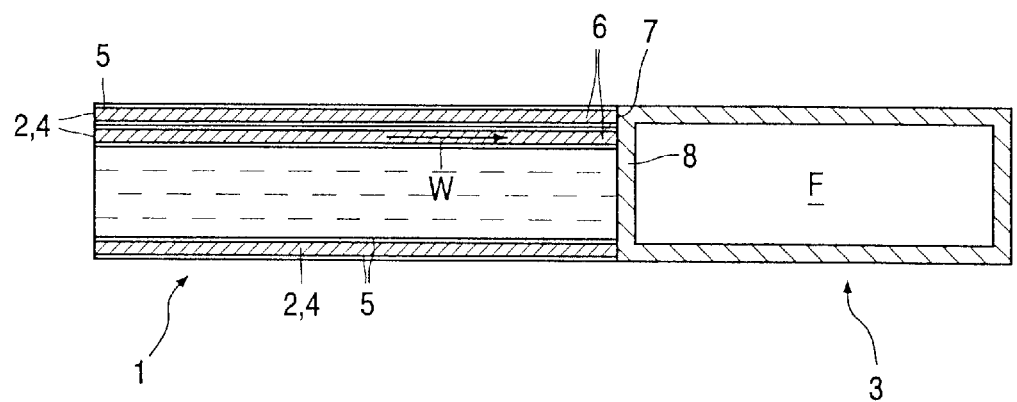
Figure 3:
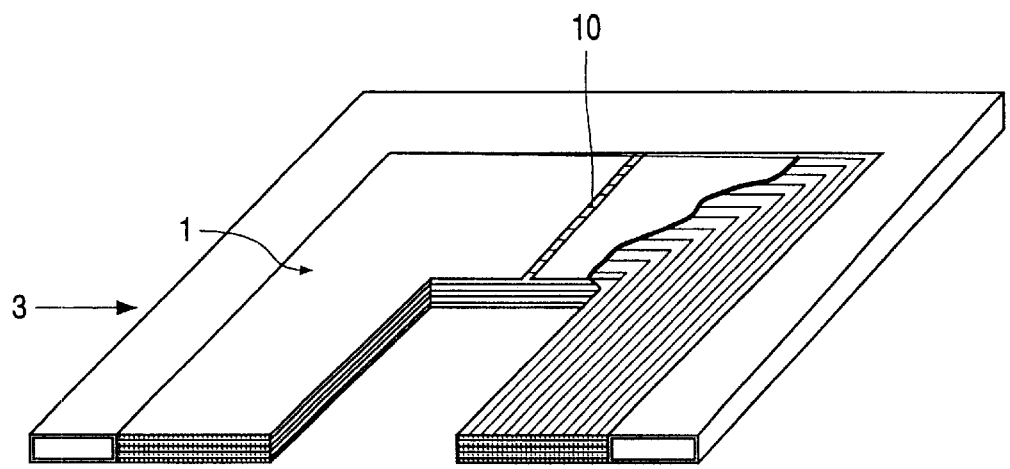
Figure 4:
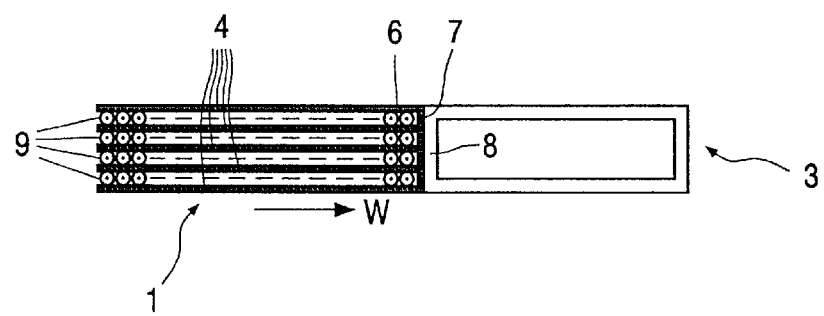
Figure 5:
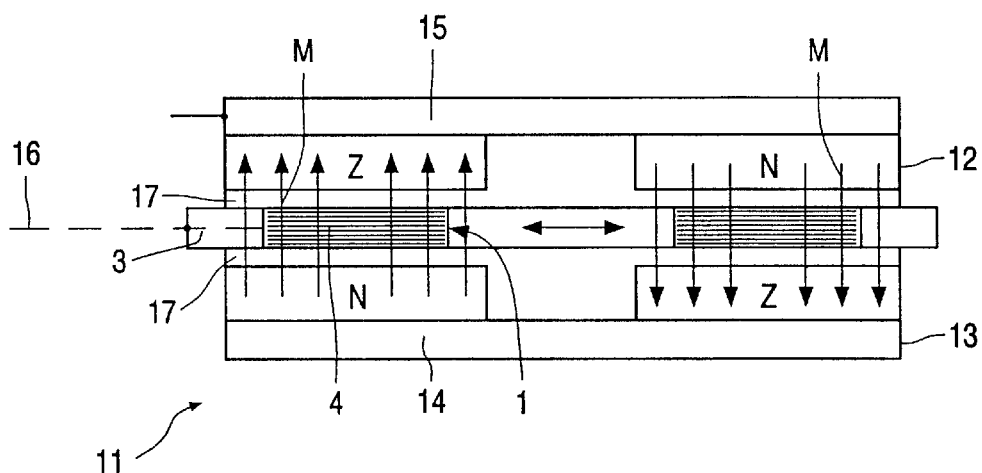
Figure 6:
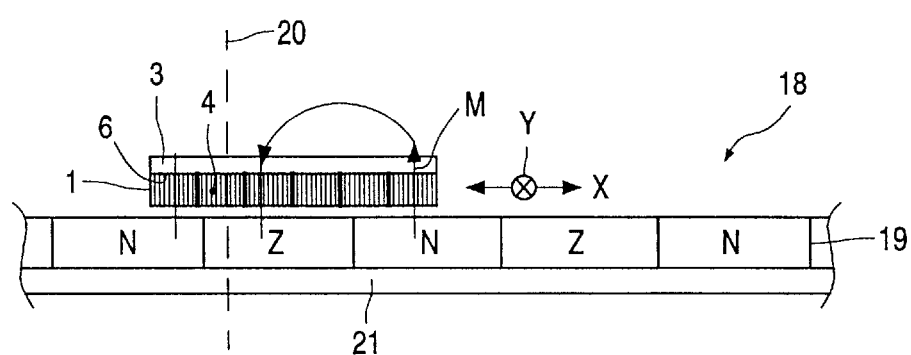

The invention will now be explained in more detail below with reference to a few embodiments shown in diagrammatic drawings, in which FIG. 1 shows a coil with a cooling channel in perspective view, FIG. 2 is a cross-sectional view of the coil of FIG. 1 taken on the line II—II, FIG. 3 is a perspective view of an alternative embodiment of the coil of FIG. 1, FIG. 4 shows a detail of the coil of FIG. 3, FIG. 5 shows an actuator in which the first embodiment of the coil is used, and FIG. 6 shows an actuator in which the second embodiment of the coil is used.

FIG. 1 shows a flat coil 1 with current-conducting foil turns 2, a cooling channel 3 being provided around the coil. The arrow I indicates a current direction. A cooling liquid is pumped through the cooling channel, as indicated with an arrow F. As FIG. 2 shows, the coil is formed by a number of (copper) foil turns 4 which are separated from one another by insulation layers 5. The ends 7 of the edge portions 6 of the turns are in contact with the wall 8 of the cooling channel 3. Obviously, the ends of the edges of the turns must not make contact with one another. To prevent this contact, a heat-conducting epoxy layer may be provided on said ends, i.e. over the entire lateral side of the coil. The heat generated in the coil flows through the (copper) foils 4 to the edge portions 6, as indicated by an arrow W, because this is the coldest spot. The current-conducting foil turns 2 in this example, therefore, at the same time serve as the heat-conducting turns 4.

FIGS. 3 and 4 show a coil with electrically insulated current wire turns 9. A number of wire windings lie above one another in layers, said layers being separated from one another by heat-conducting (copper) foil turns 4. The ends 7 of the edge portions 6 of these foil turns are thermally connected to a wall 8 of the cooling channel 3. Obviously, the foil turns now are allowed to make contact with one another. The heat arising in the (copper) wire turns 9 is transported from the wire through the insulating layer to the foil turns 4, and then to the edge portions 6 thereof which adjoin the cooling channel 3, where cooling takes place. To prevent undesirable eddy currents from arising in the heat-conducting foil turns, said turns are interrupted as shown in FIG. 3 with the double line 10.

FIG. 5 shows an example of a Lorentz X-Y actuator 11. The actuator is built up from two systems 12, 13 of N-Z magnets situated one above the other, a Z-magnet lying opposite an N-magnet each time. A cooled coil 1, 3 as described above is present between the systems. The coil is present in a homogeneous magnetic field. The direction of the magnetic field through the coil is indicated with arrows M. Closing plates for the magnetic circuit are referenced 14 and 15. The foil turns 4 of the coil extend in a plane 16 perpendicular to the magnetic field M. The coil moves parallel to the plane 16 in which the foil turns 4 are oriented. Since the coil can be so effectively cooled, as described above, it is possible to make the (air) gaps 17 between the coil and the magnets small, so that a strong and homogeneous magnetic field arises, which renders the actuator suitable for use at high powers. The actuator can be incorporated in equipment in a simple manner thanks to its flat, i.e. small dimensions. In practice, it may be either the coil or the magnets which form the moving part. If the magnets move, this has the advantage that the electrical connections and the tubing for the cooling need not move. This renders the actuator particularly suitable for use in a wafer stepper in which operations take place in vacuum.

Finally, FIG. 6 shows a second embodiment of an actuator 18 with a cooled coil 1, 3 according to the invention. The actuator now consists of one system 19 of alternating N- and Z-magnets, with the coil arranged immediately above the magnets, a three-phase coil in this case. The direction of the magnetic field M is parallel to the plane 20 in which the foil turns 4 are oriented. A closing plate for the magnetic circuit is referenced 21. The X- or Y-movement of the coil is perpendicular to the plane 20 of the turns. The cooling channel 3 now lies at one side only of the coil 1, i.e. at that side where the edge portions 6 of the turns 4 face away from the system 19 of magnets. If the actuator is to be capable of performing an X- and Y-movement, the magnets must be arranged in a chessboard pattern, and at least a second coil is to be provided which is oriented perpendicularly to the first coil.

What is claimed is:

1. A coil (1) comprising:

current-conducting turns (2); and cooling means (3), wherein coil (1) has a number of heat-conducting foil turns (4) of which edge portions (6) are cooled by the cooling means (3).

2. The coil (1) of claim 1, wherein the edge portions (6) are thermally connected to the cooling means (3).

3. The coil (1) of claim 1, wherein the cooling means has a cooling channel (3) through which a cooling liquid flows.

4. The coil (1) of claim 1, wherein the heat-conducting foil turns (4) at the same time form the current-conducting turns (2).

5. The coil (1) of claim 1, wherein the current-conducting turns (2) are electrically insulated wire turns (9) between which the heat conducting foil turns (4) are present.

6. The coil (1) of claim 5, wherein the heat-conducting foil turns (4) have interruptions (10) for preventing eddy currents.

7. An actuator (11) comprising:

two systems (12, 13) of permanent N- and Z-magnets lying one above the other between a coil (1) with current-conducting turns (2) and cooling means (3), wherein the direction of a magnetic field M generated by the magnets is perpendicular to the plane (16) in which a number of heat-conducting foil turns (4) are oriented, and the coil (1) is movable with respect to the systems (12, 13) of magnets in a direction parallel to the plane (16) in which the foil turns (4) are oriented.

8. An actuator (18) comprising:

a system (19) of alternating permanent N- and Z-magnets above which a coil (1) with current-conducting turns (2) and cooling means (3), wherein the direction of a magnetic field (M) generated by the magnets is parallel to the plane (20) in which a number of heat-conducting foil turns (4) are oriented, and the coil is movable with respect to the system of magnets in a direction (X,Y) which is perpendicular to the plane (20) in which the foil turns (4) are oriented.

9. The actuator (11) of claim 7, wherein the cooling means (3) cools edge portions (6) of the number of heat-conducting foil turns (4).

10. The actuator (11) of claim 9, wherein the heat-conducting foil turns (4) at the same time form the current-conducting turns (2).

11. The actuator (11) of claim 9, wherein the current-conducting turns (2) are electrically insulated wire turns (9) between which the heat conducting foil turns (4) are present.

12. The actuator (11) of claim 11, wherein the heat-conducting foil turns (4) have interruptions (10) for preventing eddy currents.

13. The actuator (11) of claim 8, wherein the coil (1) has cooling means (3) for cooling edge portions (6) of the number of heat-conducting foil turns (4).

14. The actuator (11) of claim 13, wherein-the heat-conducting foil turns (4) at the same time form the current-conducting turns (2).

15. The actuator (11) of claim 13, wherein the current-conducting turns (2) are electrically insulated wire turns (9) between which the heat conducting foil turns (4) are present.

16. The actuator (11) of claim 15, wherein the heat-conducting foil turns (4) have interruptions (10) for preventing eddy currents.

17. The coil (1) of claim 4, wherein the edge portions (6) are thermally connected to the cooling means (3).

18. The coil (1) of claim 4, wherein the cooling means has a cooling channel (3) through which cooling liquid flows.

19. The coil (1) of claim 5, wherein the edge portions (6) are thermally connected to the cooling means (3).

20. The coil (1) of claim 5, wherein the cooling means has a cooling channel (3) through which cooling liquid flows.

* * * * *